(12) United States Patent
Topak et al.

(10) Patent No.: US 10,109,604 B2
(45) Date of Patent: Oct. 23, 2018

(54) PACKAGE WITH EMBEDDED ELECTRONIC COMPONENTS AND A WAVEGUIDE CAVITY THROUGH THE PACKAGE COVER, ANTENNA APPARATUS INCLUDING PACKAGE, AND METHOD OF MANUFACTURING THE SAME

(71) Applicant: Sony Corporation, Tokyo (JP)

(72) Inventors: Ali Eray Topak, Stuttgart (DE); Marcel Daniel Blech, The Hague (NL)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/078,527

(22) Filed: Mar. 23, 2016

(65) Prior Publication Data
US 2016/0293557 A1  Oct. 6, 2016

(30) Foreign Application Priority Data

Mar. 30, 2015 (EP) ..................... 15161619

(51) Int. Cl.
*H01L 23/66* (2006.01)
*H01L 23/538* (2006.01)
(Continued)

(52) U.S. Cl.
CPC .......... *H01L 23/66* (2013.01); *H01L 23/5384* (2013.01); *H01L 23/5389* (2013.01);
(Continued)

(58) Field of Classification Search
CPC .............. H01L 21/76254; H01L 23/66; H01L 23/5384; H01L 23/5389; H01L 23/645; H01L 23/3128; H01L 23/49816; H01L 23/5385; H01L 25/0655; H01L 2223/6627; H01L 2223/6677; H01L 2223/6683; H01L 2224/04105; H01L 2224/24137; H01L 2224/73267; H01L 2924/15153; H01L 2924/15311; H01L 2924/16153;
(Continued)

(56) References Cited

U.S. PATENT DOCUMENTS 8,674,885 B2    3/2014  Leiba et al.
2011/0057741 A1*  3/2011  Dayan ................. H01P 5/107
                                                    333/26
(Continued)

OTHER PUBLICATIONS

Topak et al. "Broadband Interconnect Design for Silicon-Based System-in-Package Applications up to 170 GHz", Proceedings of the 43' European Microwave Conference, 2013.*
(Continued)

*Primary Examiner* — Marc Armand
*Assistant Examiner* — Younes Boulghassoul
(74) *Attorney, Agent, or Firm* — Xsenus LLP

(57) ABSTRACT

A package for embedding one or more electronic components comprises a carrier structure a silicon-based carrier layer, one or more electronic components embedded in one or more cavities formed in the carrier layer, and a cover structure arranged on top of the carrier structure. The cover structure comprises a cover layer and one or more cavities formed in the cover layer. An antenna element and/or a waveguide for connection to an antenna element is formed in and/or on top of the cover layer and coupled to the one or more cavities.

10 Claims, 14 Drawing Sheets

(51) Int. Cl.
*H01Q 13/18* (2006.01)
*H01Q 21/28* (2006.01)
*H01L 23/64* (2006.01)
*H01L 25/065* (2006.01)
*H01P 3/12* (2006.01)
*H01P 3/14* (2006.01)
*H01P 5/107* (2006.01)
*H01L 23/31* (2006.01)
*H01Q 21/06* (2006.01)
*H01L 23/498* (2006.01)

(52) U.S. Cl.
CPC ........ *H01L 23/645* (2013.01); *H01L 25/0655* (2013.01); *H01P 3/121* (2013.01); *H01P 3/14* (2013.01); *H01P 5/107* (2013.01); *H01L 23/3128* (2013.01); *H01L 23/49816* (2013.01); *H01L 23/5385* (2013.01); *H01L 2223/6627* (2013.01); *H01L 2223/6677* (2013.01); *H01L 2223/6683* (2013.01); *H01L 2224/04105* (2013.01); *H01L 2224/24137* (2013.01); *H01L 2224/73267* (2013.01); *H01L 2924/15153* (2013.01); *H01L 2924/15311* (2013.01); *H01L 2924/16153* (2013.01); *H01L 2924/16251* (2013.01); *H01L 2924/3025* (2013.01); *H01Q 13/18* (2013.01); *H01Q 21/064* (2013.01); *H01Q 21/28* (2013.01)

(58) Field of Classification Search
CPC ............ H01L 2924/3025; H01Q 13/02; H01Q 13/0266; H01Q 13/06; H01Q 13/065; H01Q 13/0283; H01Q 13/18; H01Q 21/064; H01Q 21/28; H01P 3/121; H01P 3/14; H01P 5/107; H01P 5/08; H01P 5/08107; H01P 11/00; H01P 11/001; H01P 5/085

USPC .............................. 257/664; 333/26, 33, 247
See application file for complete search history.

(56) References Cited

U.S. PATENT DOCUMENTS

| | | | |
|---|---|---|---|
| 2012/0176285 A1* | 7/2012 | Morgia | H01P 5/107 343/772 |
| 2012/0182066 A1* | 7/2012 | Merkle | H05K 1/0243 327/564 |
| 2014/0239465 A1 | 8/2014 | Yen et al. | |
| 2014/0285393 A1* | 9/2014 | Biglarbegian | H01P 5/107 343/850 |
| 2014/0287703 A1 | 9/2014 | Herbsommer et al. | |
| 2015/0229017 A1* | 8/2015 | Suzuki | H01P 5/107 333/26 |
| 2015/0285998 A1* | 10/2015 | Babakhani | G02B 6/13 438/27 |
| 2017/0324135 A1* | 11/2017 | Blech | H01P 5/107 |

OTHER PUBLICATIONS

Sanming Hu et al. "Compact High-Gain mmWave Antenna for TSV-Based System-in-Package Application", IEEE Xpolre Abstract, 2014, 2 pages.

Mahmoud Al Henawy et al "Integrated Antennas in eWLB packages for 77GHz and 79 GHz Automotive Radar Sensors", Proceedings of the 41$^{st}$ European Microwave Conference, 2011, 4 pages.

Eray Topak et al. " Broadband Interconnect Design for Silicon-Based System-in-Package Applications up to 170 GHz", Proceedings of the 43$_{rd}$ European Microwave Conference, 2013 4 pages.

Yunchi Zhang et al "A Waveguide to Microstrip Inline Transition with Very Simple Modular Assembly", IEEE Microwave and Wireless Components Letters, vol. 20, No. 9, 2010, 3 pages.

L. Dussopt et al. " Millimeter-Wave Ultra-Wide0Band Antenna Array Integrated on Silicon with BCB Membranes", 2012 IEEE, 2012, 2 pages.

* cited by examiner

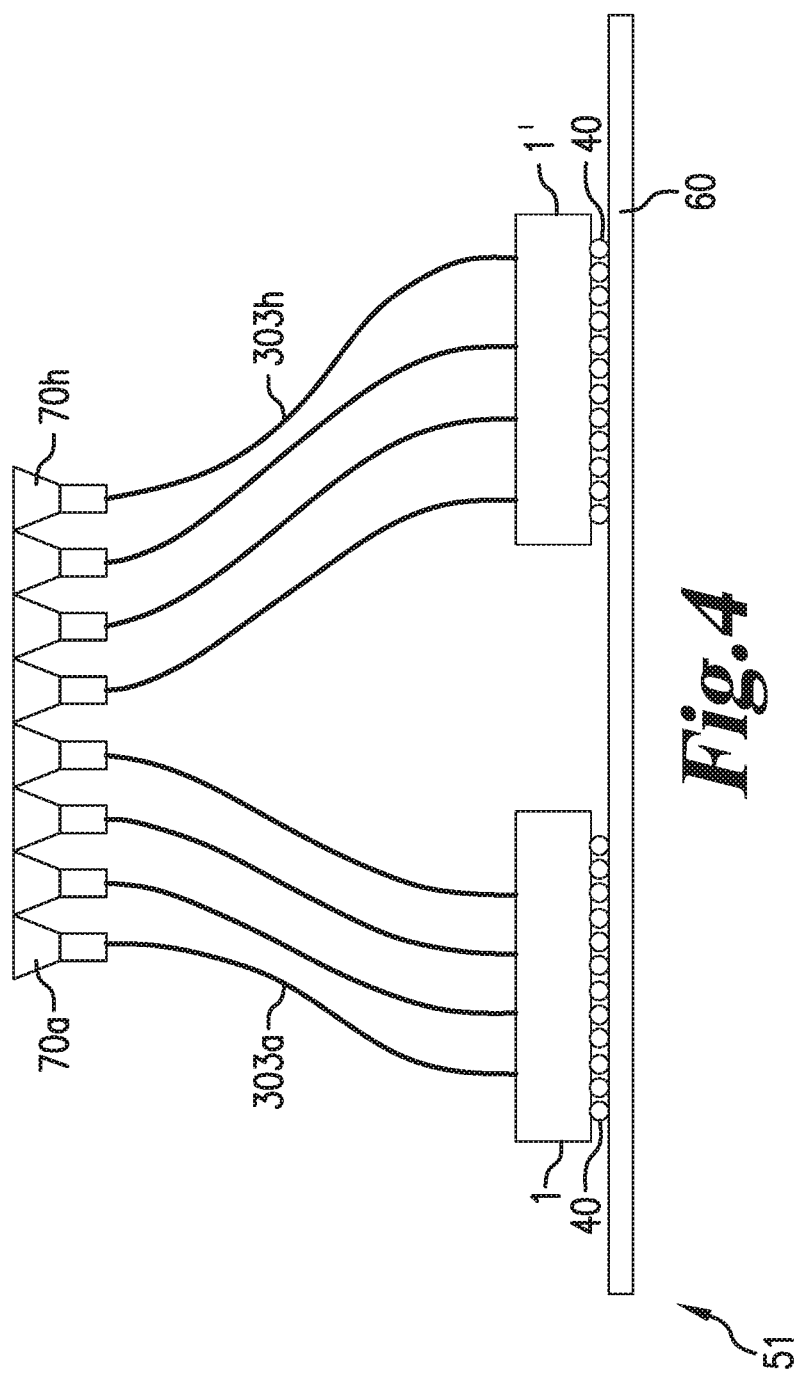

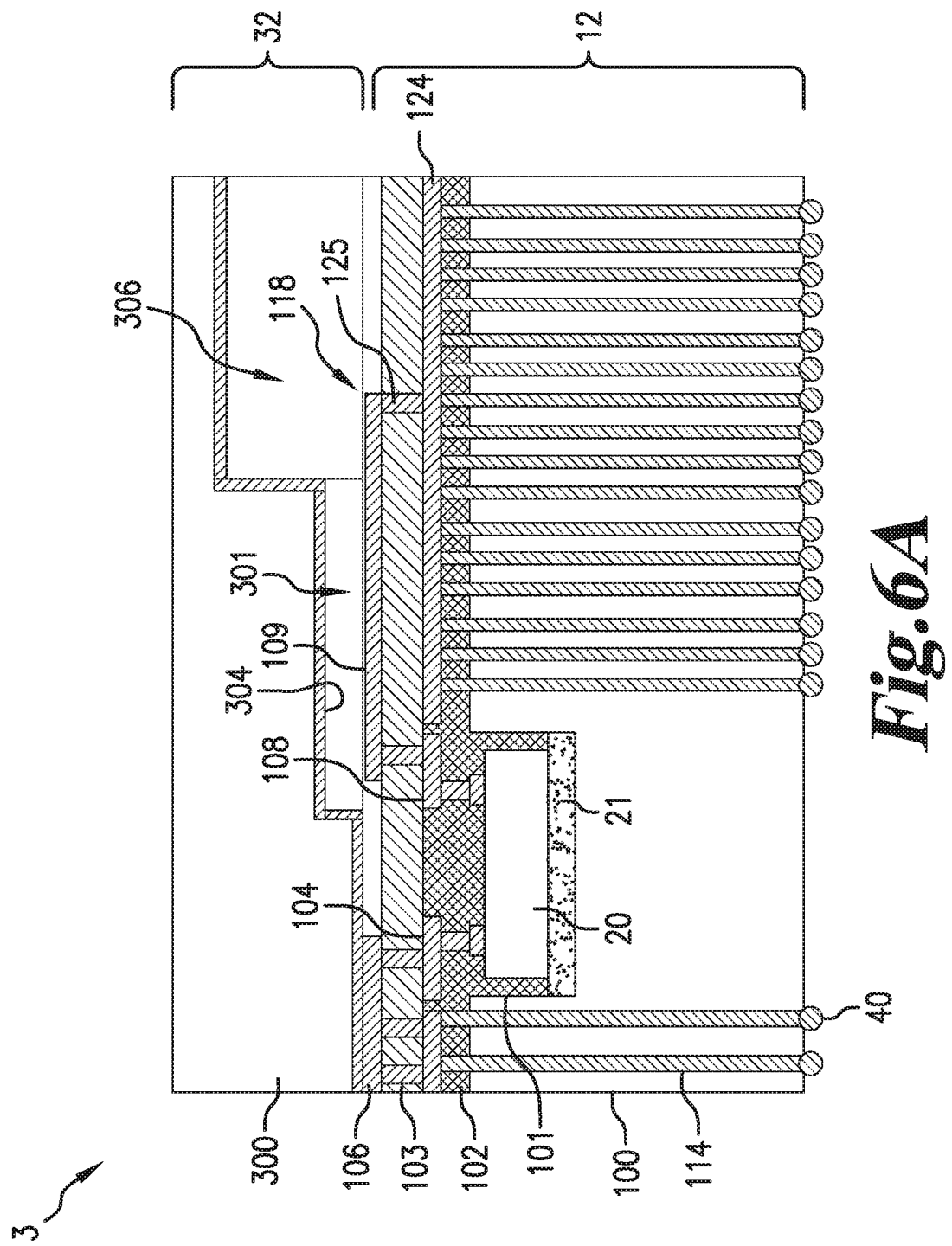

PACKAGE WITH EMBEDDED ELECTRONIC COMPONENTS AND A WAVEGUIDE CAVITY THROUGH THE PACKAGE COVER, ANTENNA APPARATUS INCLUDING PACKAGE, AND METHOD OF MANUFACTURING THE SAME

BACKGROUND

Field of the Disclosure

The present disclosure relates to a package for embedding one or more electronic components, particularly by use of a silicon-based packaging technology. The present disclosure relates further to an antenna apparatus including a package, especially for use in millimeter-wave frequency systems, and to a method for manufacturing a package.

Description of Related Art

State of the art mm-wave radar chipsets at 77 GHz (and above) use so called embedded wafer level ball grid array (eWLB) surface mount technology for soldering on a PCB like an SMT type electronic component. An eWLB package has "hot" interconnects, which means the RF signal is fed through the solder pins to a transmission line structure on a printed circuit board (PCB), which guides the signal to an antenna, which is also located on the PCB. As the dielectric losses and the losses of the interconnect are very high in E-band, this solution results in an increased noise figure. Furthermore, expensive low loss PCB substrates are required. In general, this approach is very limited in frequency. The ball-grid array (BGA) interconnect significantly deteriorates above 80 GHz.

Therefore, recent research activities are focused onto antenna integration in the eWLB package. In one example a planar antenna is used on a redistribution layer (RDL). A metal ground plane is employed on a PCB as backshort to redirect the radiated energy to normal direction. However, as the antenna is covered by some polymer mold mass and the package features many edges, scattering and diffraction occur. This has a negative impact on the antenna pattern, which typically results in some ripples.

Using eWLB technology there is little means to improve the antenna performance. The distance of the backshort depends on the accurate soldering of the package, which can hardly be ensured. Using a multi-layer RDL could solve this issue, but increases the cost and system complexity. The components in the upper hemisphere of the antenna also contribute significantly to the deterioration of the pattern. It is almost impossible to shield an electronic component or the edges of the mold mass in a low-cost manner from the radiation of the omnidirectional antenna. Another drawback is the limitation of the eWLB package size. This limitation in size causes limited number of mm-wave channels. At 77 GHz max. 4 antennas can be integrated into the package. Cascading multiple ICs in one package is also very limited. Therefore, deployment of massive MIMO systems (for example an imaging array) in the millimeter-wave range is very difficult.

EP 2477466 A2 discloses a monolithic multichip package, a carrier structure for such a package as well as manufacturing methods for manufacturing such a package and such a carrier structure to obtain a package that fully shields different functions of a mm-wave/THz system. The package is poured into place by polymerizing photo sensitive monomers. It gradually grows around and above the MMICs (Monolithically Microwave Integrated Circuit) making connection to the MMICs but recessing the high frequency areas of the chip. This approach leads to functional blocks that are electromagnetically completely shielded. These units can be combined and cascaded according to system needs.

It shall be noted that herein reference is made to the frequency range of 30-300 GHz as mm-wave frequency range. THz frequencies and THz applications often refer falsely to a spectrum starting from 300 GHz in literature. This commonly accepted definition is adopted hereinafter, although the spectrum should actually be called the Sub-THz frequency range. Thus, references made to THz frequencies hereinafter shall be understood as comprising a frequency range from at least 300 GHz to 3 THz. Hereinafter, reference is also made to microwave frequencies, which shall be understood as the same frequency range of approximately 30 GHz to 3 THz. Microwave integrated circuits may operate up to at least 3 THz.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object of the present disclosure to provide a package for embedding one or more electronic components and to an antenna apparatus comprising such a package which provide low losses, low manufacturing costs and high repeatability at high frequencies of interest.

According to an aspect of the present disclosure there is provided a package for embedding one or more electronic components, in particular microwave integrated circuits and discrete passive components, the package comprising:
  a carrier structure including
    a silicon-based carrier layer comprising one or more cavities for placing one or more electronic components therein,
    a first polymer layer formed on top of the carrier layer,
    a second polymer layer formed on top of the first polymer layer,
    metallization layers for use as signaling and ground layers formed in predetermined areas between the first polymer layer and the second polymer layer and on top of the second polymer layer, and
    interconnection terminals for interconnecting the one or more electronic components and the metallization layers,
  ii) one or more electronic components embedded in one or more cavities formed in the carrier layer,
  iii) a cover structure arranged on top of the carrier structure, the cover structure including
    a cover layer formed of silicon or a mold mass,
    one of more cavities formed at least partly above one or more metallization layers used as signaling layers,
    an antenna element and/or a waveguide for connection to an external antenna element, the antenna element and/or the waveguide being formed in and/or on top of the cover layer and coupled to the one or more cavities.

According to a further aspect of the present disclosure there is provided an antenna apparatus comprising:
  a package as disclosed herein, one or more antenna elements formed in or on the package or arranged separate from and coupled to the package, and a board supporting the package.

According to still another aspect a method of manufacturing a package is presented. The method comprises i) forming a carrier structure by
   forming in a silicon-based carrier layer one or more cavities,
   placing one or more electronic components in said one or more cavities,
   forming a first polymer, layer on top of the carrier layer,
   forming a second polymer layer on top of the first polymer layer,
   forming metallization layers for use as signaling and ground layers in predetermined areas between the first polymer layer and the second polymer layer and on top of the second polymer layer, and
   forming interconnection terminals for interconnecting the one or more electronic components and the metallization layers, ii) forming a cover structure on top of the carrier structure by
   forming a cover layer of silicon or a mold mass, wherein one or more cavities are formed at least partly above one or more metallization layers used as signaling layers, and
   forming an antenna element and/or a waveguide for connection to an external antenna element in and/or on top of the cover layer and coupled to the one or more cavities.

Preferred embodiments of the disclosure are defined in the dependent claims. It shall be understood that the claimed antenna apparatus generally has similar and/or identical preferred embodiments as described herein and as defined in the dependent claims.

According to the present disclosure the usage of a silicon-based package is proposed. Using standard silicon processing technology can ensure structural feature accuracies up to 1 μm. This gives an excellent repeatability at 77 GHz and above. In order to reduce the complexity of the board (i.e. PCB), only DC, GND, and digital and IF lines are routed via solder bumps between the package and the PCB of the antenna apparatus.

The metallization layers (sometimes also called "metallized layers") used as millimeter-wave lines (also called RF lines) are all located inside the silicon package. Therefore, use of expensive high-frequency substrate is eliminated. For low-loss and low-cost MMIC interconnections, a special stack-up is used. A low resistive silicon wafer may be used as a carrier substrate. It exhibits a thickness of 450 . . . 800 μm. Cavities are etched for the MMICs, which may be bonded by conductive silver epoxy. The RF signals are routed via a first polymer layer and a first metallization layer to a second metallization layer, which may be located on a second polymer layer. The first metallization layer may act as a ground plane for microstrip (MS) or grounded coplanar waveguides (GCPW) structured on the second metallization layer. Vias can be used to interconnect the two metallization layers.

A metallization layer may generally be any layer that is made of a metal and that forms a kind of coating on another surface. Mainly metals like aluminum, copper, silver, gold (i.e. metals having a high electrical conductivity) are used, which may be processed by deposition or etching to form a metallization layer.

The proposed approach leads to functional blocks that are electromagnetically shielded. These units can be combined and cascaded according to system needs. The danger of exciting unwanted resonant triodes inside the package, which may cause system failures hard to debug, is minimized. The functional blocks once characterized properly can be used in system simulations to investigate arbitrary system architectures. Rapid translation of system level designs into a real package will become possible and may accelerate the development of such electronic systems.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 4 shows a second embodiment of an antenna apparatus according to the present disclosure, FIG. 6A and FIG. 6B show a cross section and a top view of a third embodiment of a package according to the present disclosure.

DETAILED DESCRIPTION OF THE DISCLOSURE

Figure 1:
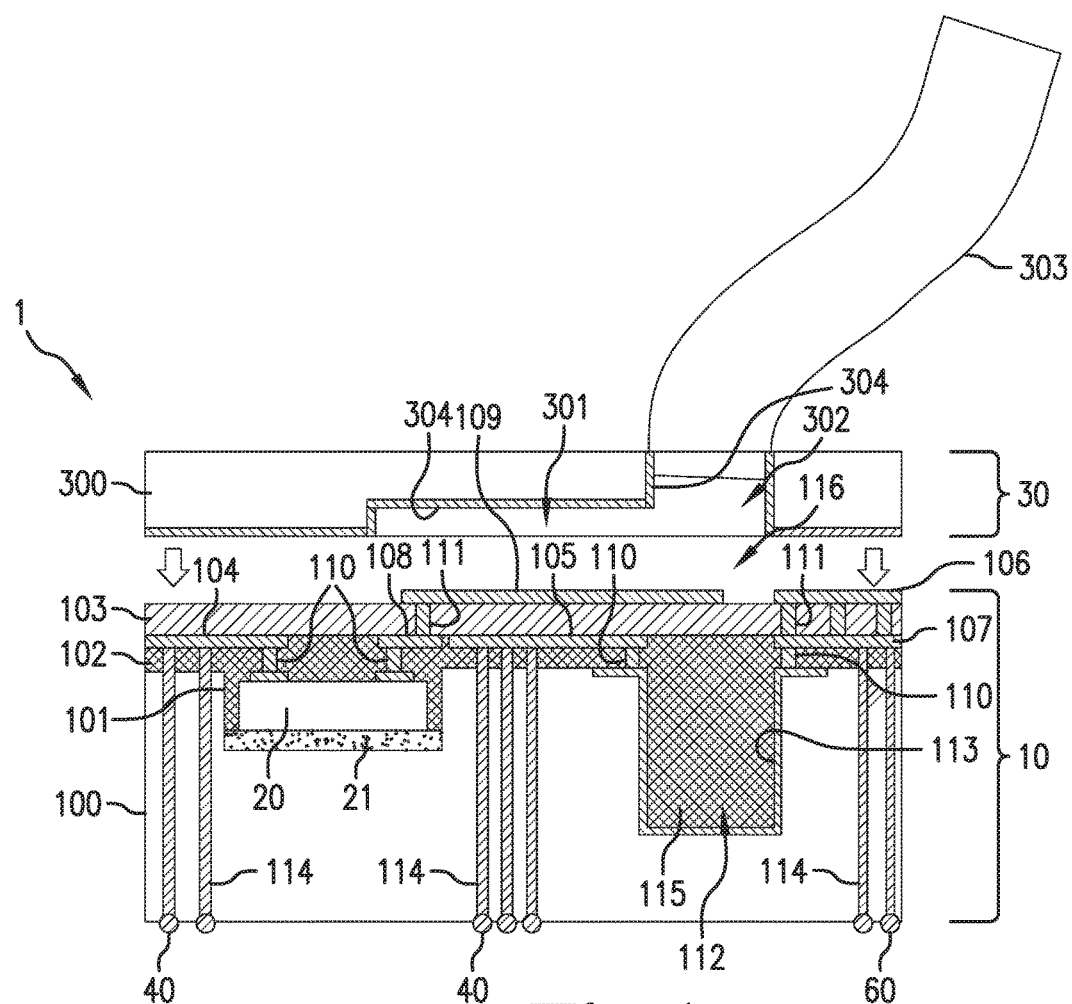
FIG. 1 shows a cross section of a first embodiment of a package in an intermediate manufacturing stage according to the present disclosure.
Figure 2:
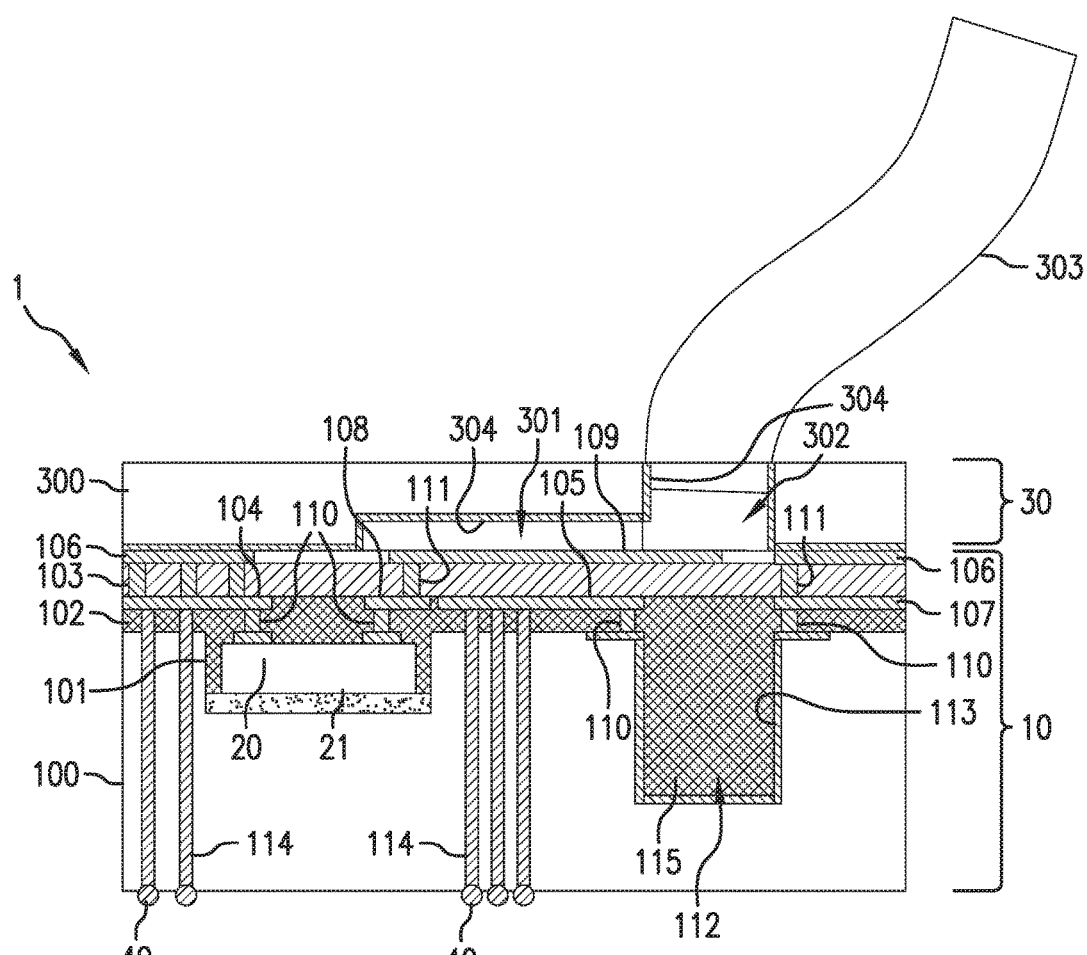
FIG. 2 shows a cross section of the first embodiment of the package in a final manufacturing stage according to the present disclosure.

Referring now to the drawings, wherein like reference numerals designate identical or corresponding parts throughout the several views, FIG. 1 shows a cross section of a first embodiment of a package 1 in an intermediate manufacturing stage according to the present disclosure. FIG. 2 shows the same package 1 in a final manufacturing stage. The package 1 comprises a carrier structure 10, one (or more) electronic component(s) 20, e.g. an MMIC, and a cover structure 30.

The carrier structure 10 comprises a silicon-based carrier layer 100 comprising one (or more) cavity (cavities) 101 for placing (embedding) the one (or more) electronic components 20 therein. The carrier layer 100 may e.g. be a low resistive silicon wafer since it is relatively cheap compared to high resistive silicon wafers. A first polymer layer 102 is formed on top of the carrier layer 100, and a second polymer layer 103 is formed on top of the first polymer layer 102. Metallization layers 104-109 are provided for use as signaling and ground layers. They are formed in predetermined areas between the first polymer layer 102 and the second polymer layer 103 and on top of the second polymer layer 103. In the embodiment shown in FIGS. 1 and 2 the metallization layers 104-107 serve as ground layers and the metallization layers 108-109 serve as signaling layers, A plurality of interconnection terminals 110, 111 serve for interconnecting the one or more electronic components 20 and the metallization layers 104-109. In other embodiments the interconnection terminals may at least partly also be used for insulation purposes, and there may also be more or less of such interconnection terminals (also called vias).

The cover structure 30 is arranged on top of the carrier structure 10, e.g. by glue, screws, soldering, etc. It comprises a cover layer 300 formed of silicon or a mold mass and one (or more) cavity (cavities) 301 formed at least partly above one (or more) metallization layer(s) 109 used as signaling layers. Further, an antenna element (not used in the first embodiment shown in FIGS. 1 and 2) and/or a waveguide 302 for connection to an antenna element (not shown in FIGS. 1 and 2) is provided, the antenna element and/or the waveguide 302 being formed in (and/or on top of) the cover layer 300 and coupled to the one (or more) cavity (cavities) 301.

In order to provide a flexible and well-shielded interface, a flexible rectangular waveguide section 303 of e.g. metal coated Teflon may be used. The waveguide section 303, the waveguide 302 and the cavity 301 may have a thin metal coating 304 of a few μm thickness on the surface. The waveguide section 303 may be inserted into a press-fit rectangular aperture of the silicon-based (or metal or metalized plastic) cover layer 300. The waveguide 302 leads through the complete cover layer 300 in a direction perpendicular to the cover layer 300.

For feeding the waveguide 302 a probe-based microstrip-to-waveguide transition 116 is used. Therefore, a (rectangular waveguide) backshort 112 is etched into the carrier layer 100 opposite the waveguide 302, preferably exhibiting a depth of a quarter guided wavelength. A metal coating 113 may be applied to the faces of the backshort 112 and the cover 100 as a reflector for the antenna. The metallization layer 109, which leads into the area between the waveguide 302 and the backshort 112, serves as feeding line (i.e. as signaling layer) for feeding the waveguide 302.

The electronic component 20 may be fixed into the cavity 101 by glue or an epoxy 21, e.g. a conductive silver epoxy. The backshort 112 may be filled with a filling material 115, e.g. the polymer of the first polymer layer 102. The cavity 301 and the waveguide 302 may also be filled with a filling material, such as mold mass or foam, or with air to avoid disturbance of the feeding signal on the feeding line 109. A mold mass shall herein be understood generally as any mass that can be processed and provided at the desired location in a molding process. Such a mold mass is generally known and e.g. used in IC manufacturing for protecting the IC from influences of the environment. Such a mold mass may e.g. be a plastic material or epoxide material.

The whole package 1 may be placed on a board, e.g. a PCB, by use of solder bumps 40. For connecting selected metallization layers (for DC, ground and signal) through silicon vias (TSV) 114 may be provided through the carrier layer 100.

Figure 3:
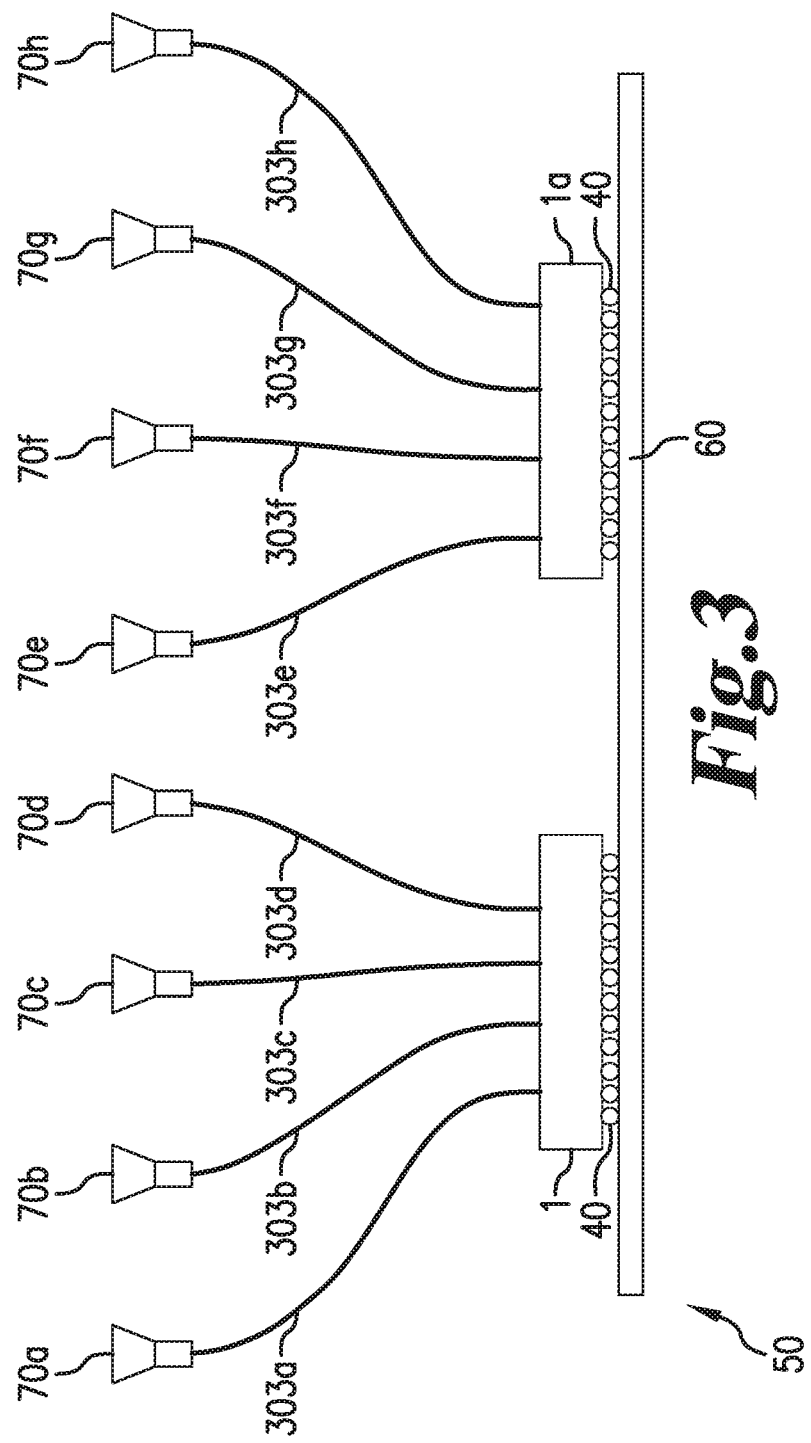
FIG. 3 shows a first embodiment of an antenna apparatus according to the present disclosure.

Multiple of the waveguide interconnects as illustrated in FIGS. 1 and 2 can be used in one package, for instance in an antenna apparatus. FIGS. 3 and 4 show two embodiments of an antenna apparatus 50, 51 according to the present disclosure. Each comprises two packages 1, 1', which are soldered to a PCB 60 via solder bumps 40. Each package 1, 1' includes several flexible waveguide sections 303a-303h, which are used to feed individual antenna elements 70a-70h to form an antenna array of arbitrary configuration. For instance, a large antenna array (FIG. 3) that is larger (in width) than the packages 1, 1' can be formed as typically used for MIMO arrays.

If the flexible rectangular waveguide sections 303a-303h are used to feed a very dense antenna array, antenna arrays can be composed, whose overall size is smaller than that of the silicon based packages 1, 1' as shown in FIG. 4. This means that by using the flexible waveguide sections 303a-303h a potentially smaller element spacing can be achieved than using antennas integrated into the package.

It is also possible to create conformal antenna arrays, which are smoothly integrated into the cover of a package. A rigid planar PCB is used inside the device and the signals are transferred to the individual antennas.

Figure 5A:
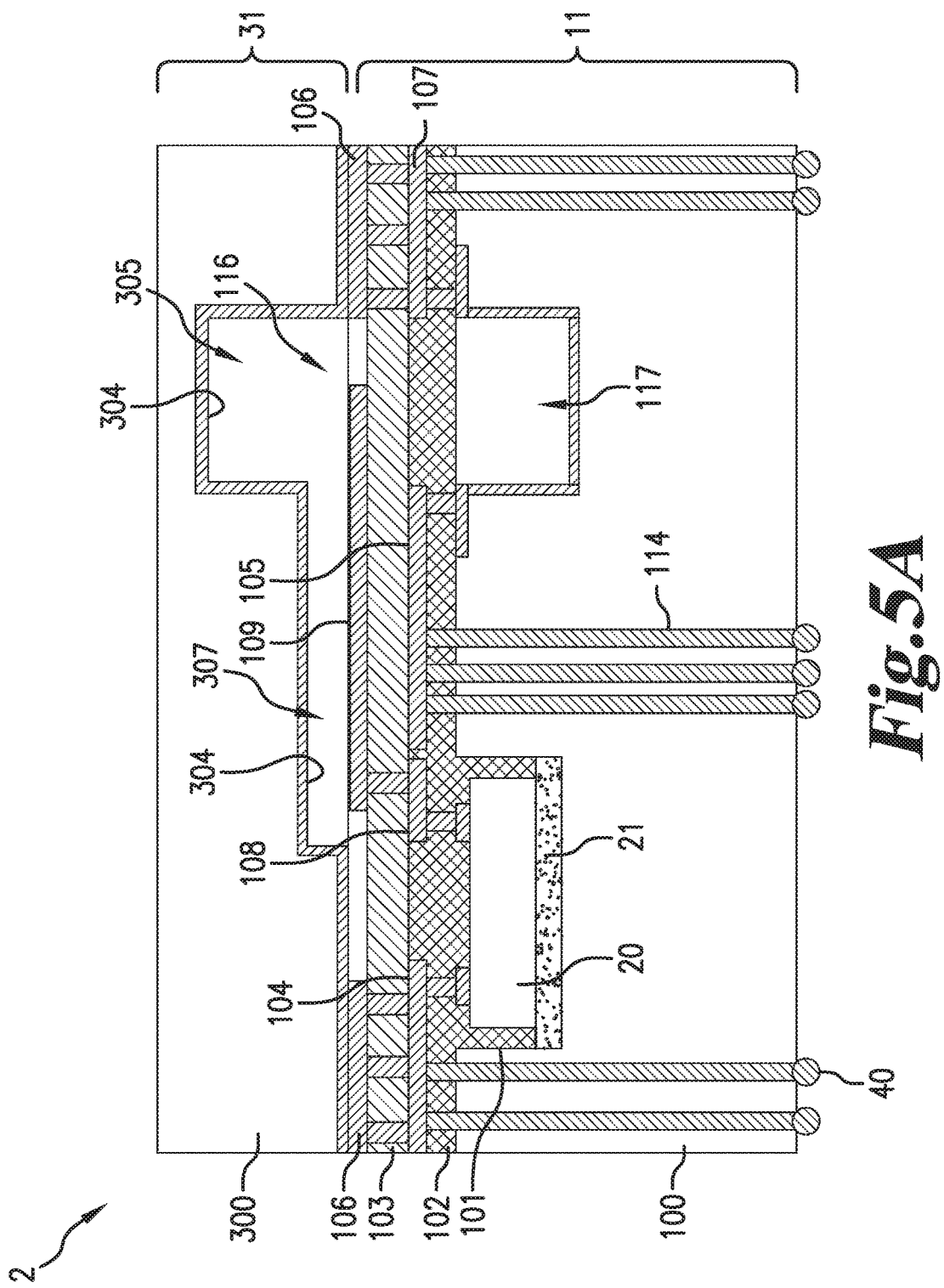
FIG. 5A and FIG. 5B show a cross section and a top view of a second embodiment of a package according to the present disclosure.
Figure 5B:
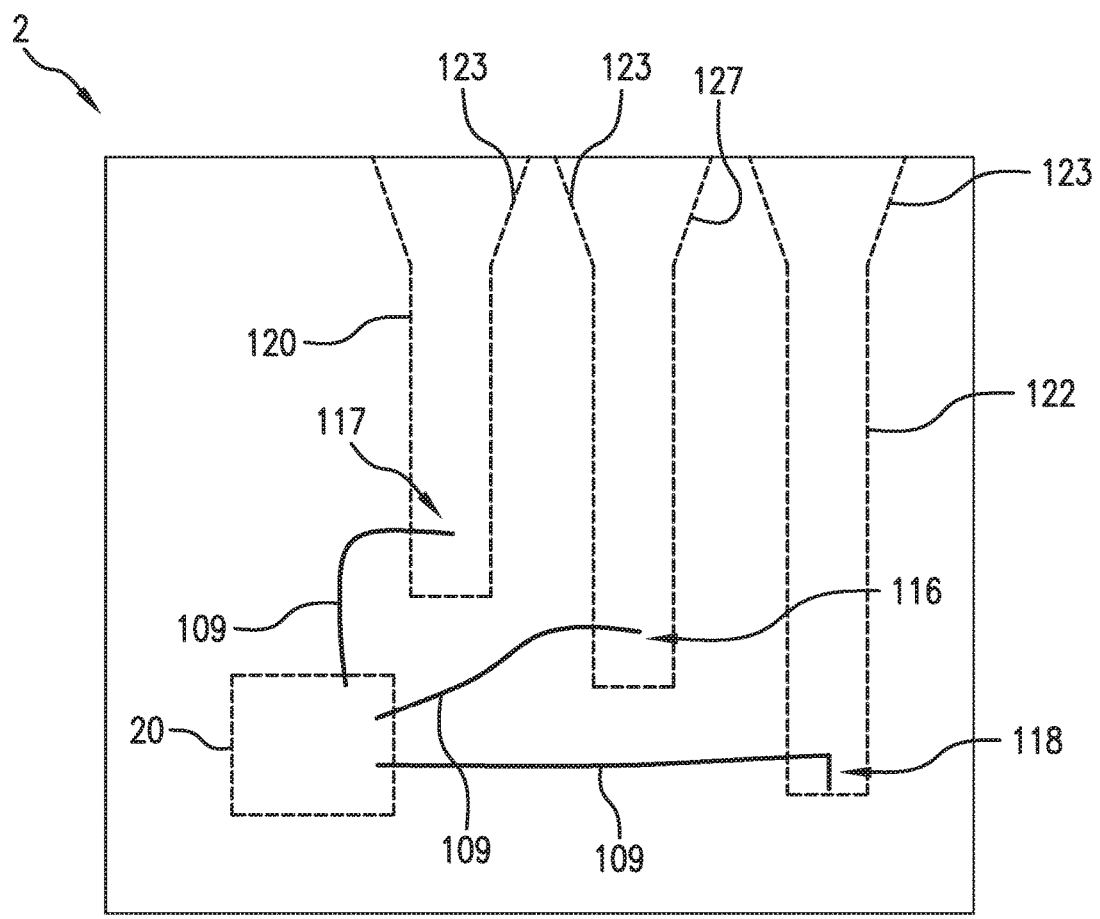

Another possibility of antenna integration into the silicon package is depicted in FIG. 5A and FIG. 5B. FIG. 5A shows across section of a second embodiment of a package 2 according to the present disclosure and FIG. 5B shows a top of the package 2 having a carrier structure 11 and a cover structure 31. In addition to the rectangular waveguide 305 formed by a trench etched into the cover layer 300, another rectangular waveguide 117 is formed by another trench etched into the silicon-based carrier layer 100 opposite the waveguide 305. These trenches 305, 117 together form a complete rectangular waveguide. In the center of this waveguide a probe feed is realized by a microstrip-to-waveguide transition 116. Alternatively a loop feed 118 can be employed. The probe or the loop, respectively, may be fabricated on a polymer membrane. This membrane consists of the first polymer layer 102 and the second polymer layer 103, which are both applied as thin films. A backshort 119 of a quarter guided wavelength may be used as well.

As shown in FIG. 5B several waveguides 120, 121, 122 can be formed in the package. They may either be used as an array of end-fired open-ended waveguides radiating to the side of the package 2, or the waveguides 120, 121, 122 can be terminated by horn apertures 123, if higher directivity of the individual antennas is needed.

Figure 6B:
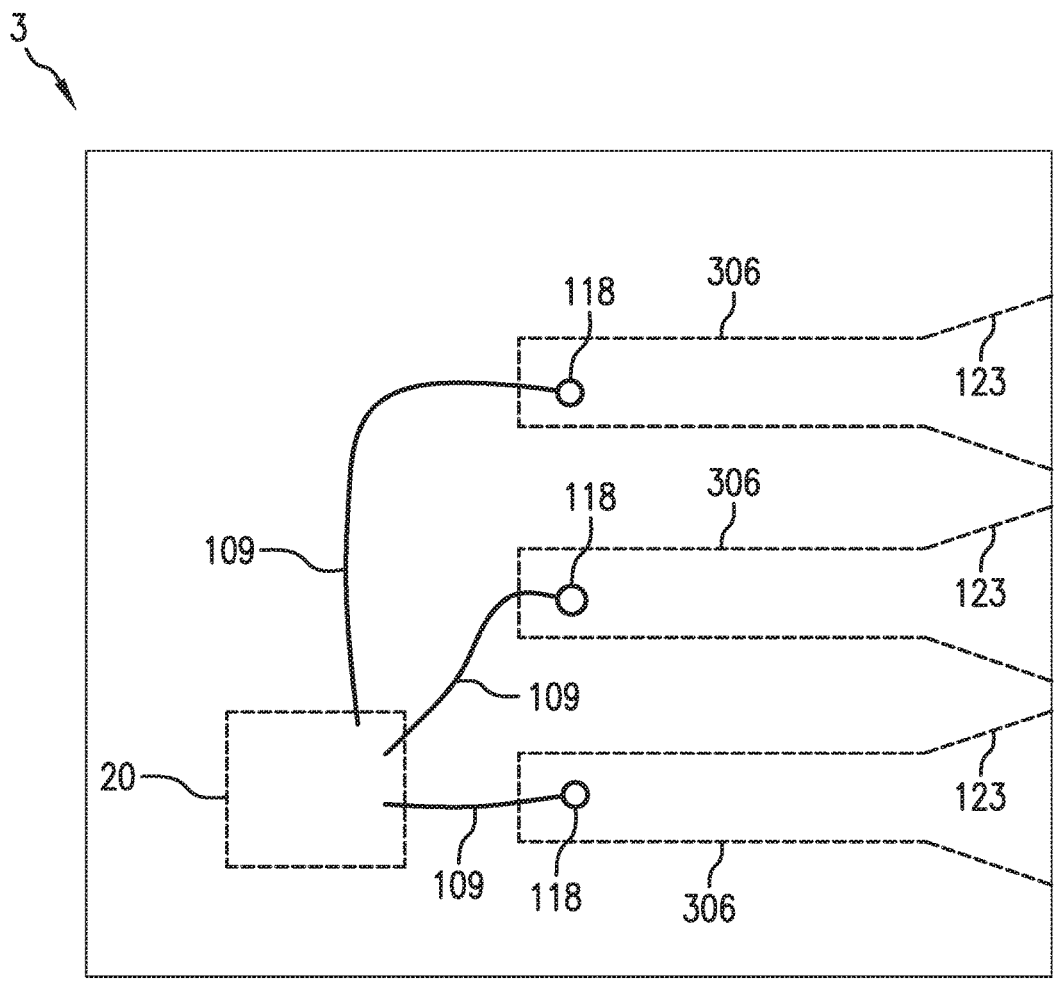

FIG. 6A shows a cross section of a third embodiment of a package 3 according to the present disclosure and FIG. 6B shows a top view of the package 3 having a carrier structure 12 and a cover structure 32. In this embodiment inline feeding of a rectangular waveguide formed by a metallization layer 124 and a trench 306 in the cover layer 300 is used. Therefore, the microstrip line 109 is fed through a hole in the backside wall of a rectangular waveguide. The microstrip line 109 is preferably terminated in a loop 118, which is formed by the microstrip line 109 and a via 125 to the metallization layer 124. An antenna array can either be formed by open-ended waveguides in the side wall of the package 3 or by horn apertures 123.

Figure 7A:
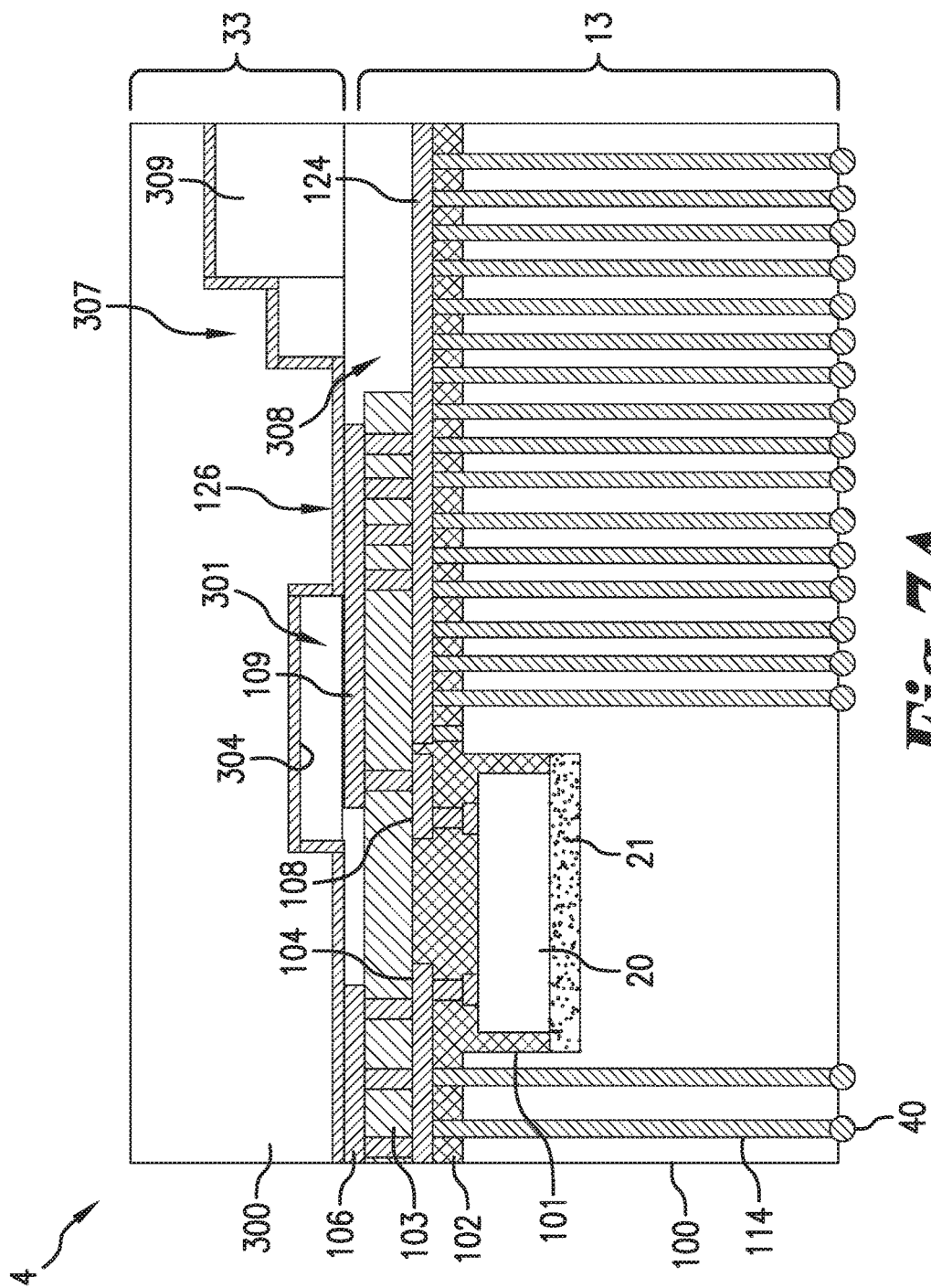
FIG. 7A and FIG. 7B show a cross section and a top view of a fourth embodiment of a package according to the present disclosure.
Figure 7B:
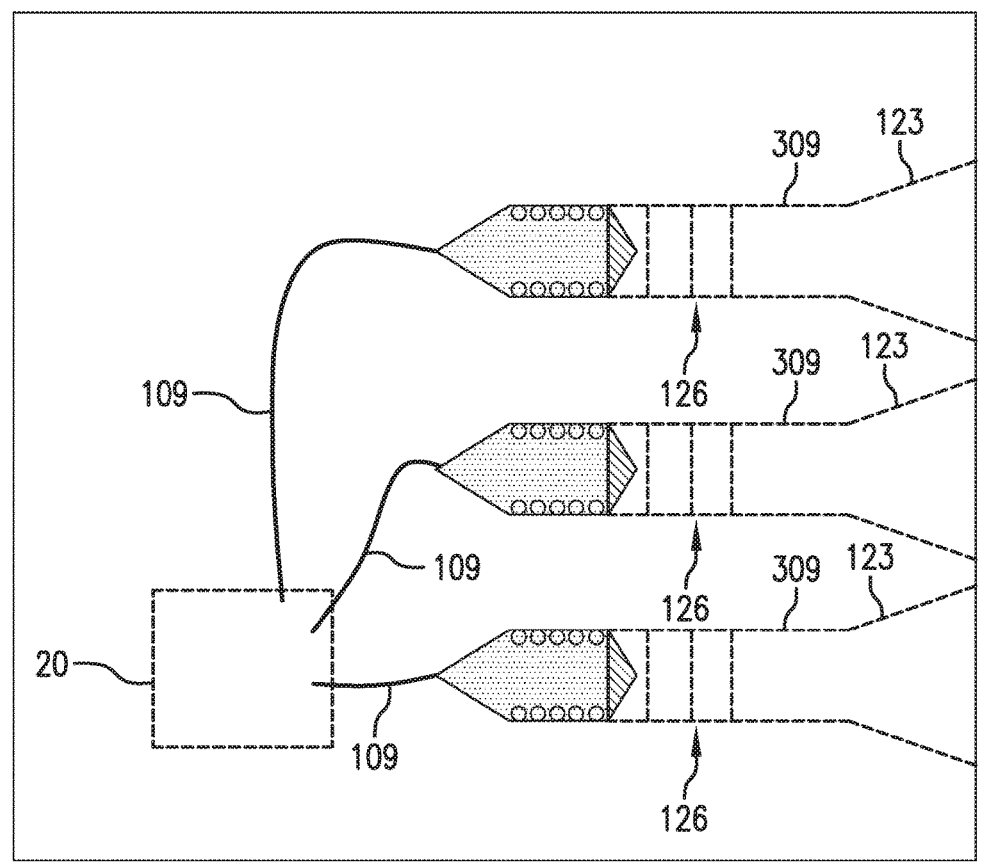

FIG. 7A shows a cross section of a fourth embodiment of a package 4 according to the present disclosure and FIG. 7B shows a top of the package 4 having a carrier structure 13 and a cover structure 33. In this embodiment, an alternative to the loop based feeding is used by feeding by a multi-stage transition 307. The microstrip line 109 is first fed into a substrate integrated waveguide (SIW) 126 bound by the metallization layers 124 and 109. The SIW 126 feeds a flat hollow waveguide section 308, which is bound by the top cover layer 300 and the metallization layer 124. This thin rectangular waveguide section 308 is transformed by the multi-stage impedance transformer 307 to a rectangular waveguide 309 having a rectangular cross-section with the typical ratio of 2:1. The rectangular waveguide 309 can be used either as open-ended waveguide on the side of the package 4, or additional horn apertures 123 can be added if needed.

Figure 8:
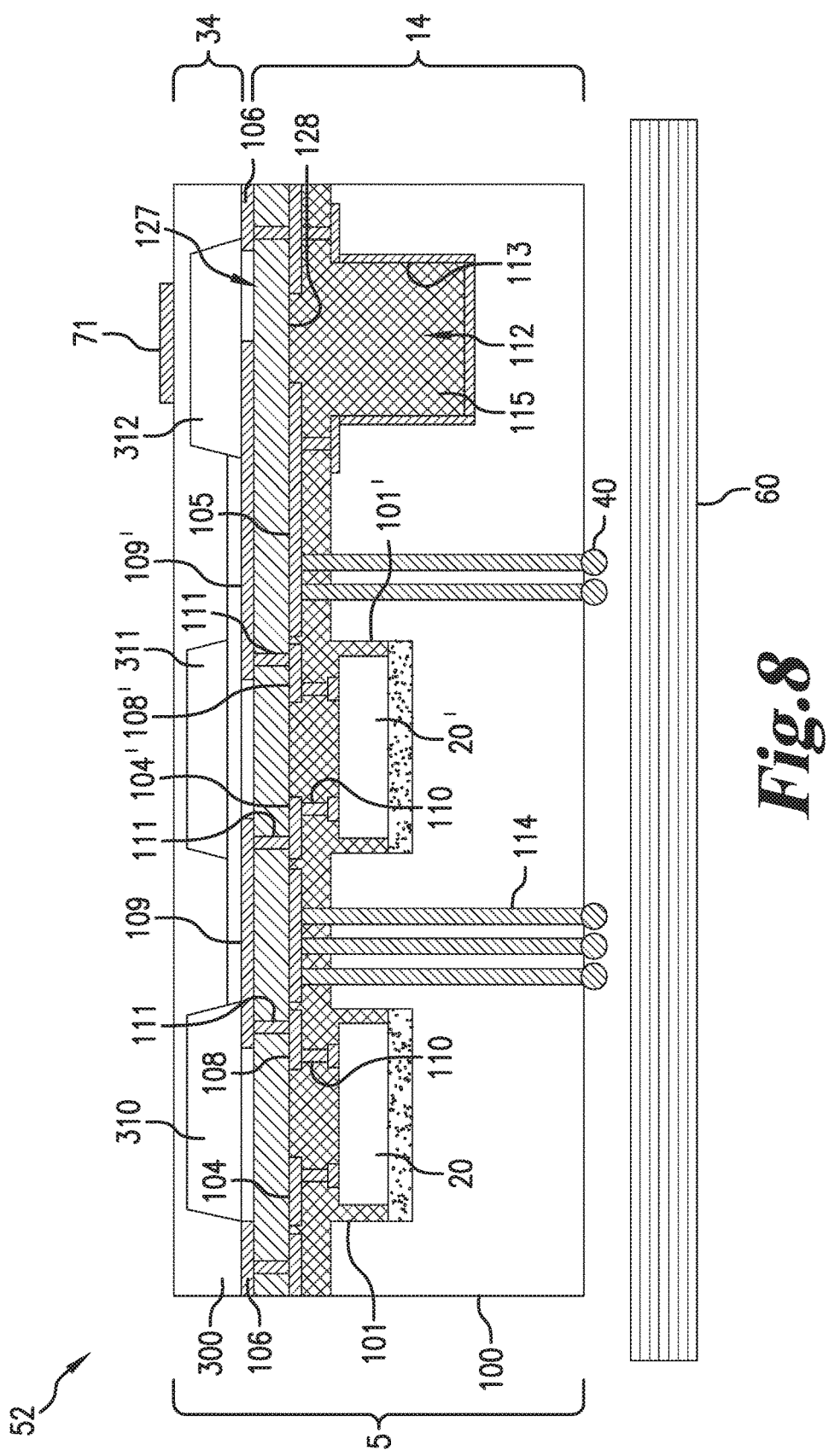
FIG. 8 shows a cross section of a third embodiment of an antenna apparatus according to the present disclosure including a fifth embodiment of a package according to the present disclosure.

FIG. 8 shows a cross section of a third embodiment of an antenna apparatus 52 according to the present disclosure including a fifth embodiment of a package 5 according to the present disclosure. Several cavities 101, 101' are fabricated on a Si-substrate representing the carrier layer 100 of the carrier structure 14 using an etching process. The MMICs 20, 20' are placed into these cavities 101, 101' using a pick-and-place machine. The transmission lines 108, 109, 104', 108', 109' and vertical interconnects 110, 111 on/within the polymer layers 102, 103 are used for routing RE/millimeter-wave signals. A low-cost low-resistivity silicon wafer can be used as a carrier layer 100. One or more antennas are fed with these transmission lines in the form of microstrip lines or grounded coplanar lines.

A cavity backed slot antenna 127 is employed within the package 5 for superior bandwidth and efficiency performances. The surface of the cavity 112 (backshort) is fully covered with metal 113 acting as a ground plane. The cavity 112 is filled with the polymer substrate 115. This filling 115 reduces the height of the cavity 112 proportional to relative dielectric permittivity ($\epsilon_r$) of the substrate. A feed line 109' terminates by an open end above the slot 128 and the cavity 112. The width of the slot 128, the cavity width, and the exact place of the feed line 109' are optimized to maintain a high gain and wide bandwidth. Combination of the cavity backed slot antenna technology with a stacked patch antenna 71 enables an ultra-wideband antenna apparatus 52. The cavity backed slot antenna 127 is employed as a primary antenna, whereas the micro-machined parasitic patch element 71 is employed as a secondary antenna. The stacked patch antenna 71 may be realized on a micro-machined silicon wafer. It acts as a protection above the antenna side.

A micro-machined silicon wafer is used as a lid (cover layer) 300 of the cover structure 34 for protection of the whole package. In the lid cavities 310, 311, 312 are formed above the MMICs 20, 20' and the slot antenna 127. The air-filled cavities 310, 311 serve particularly to suppress direct (unwanted) radiation at high frequencies from the MMICs 20, 20'.

Figure 9:
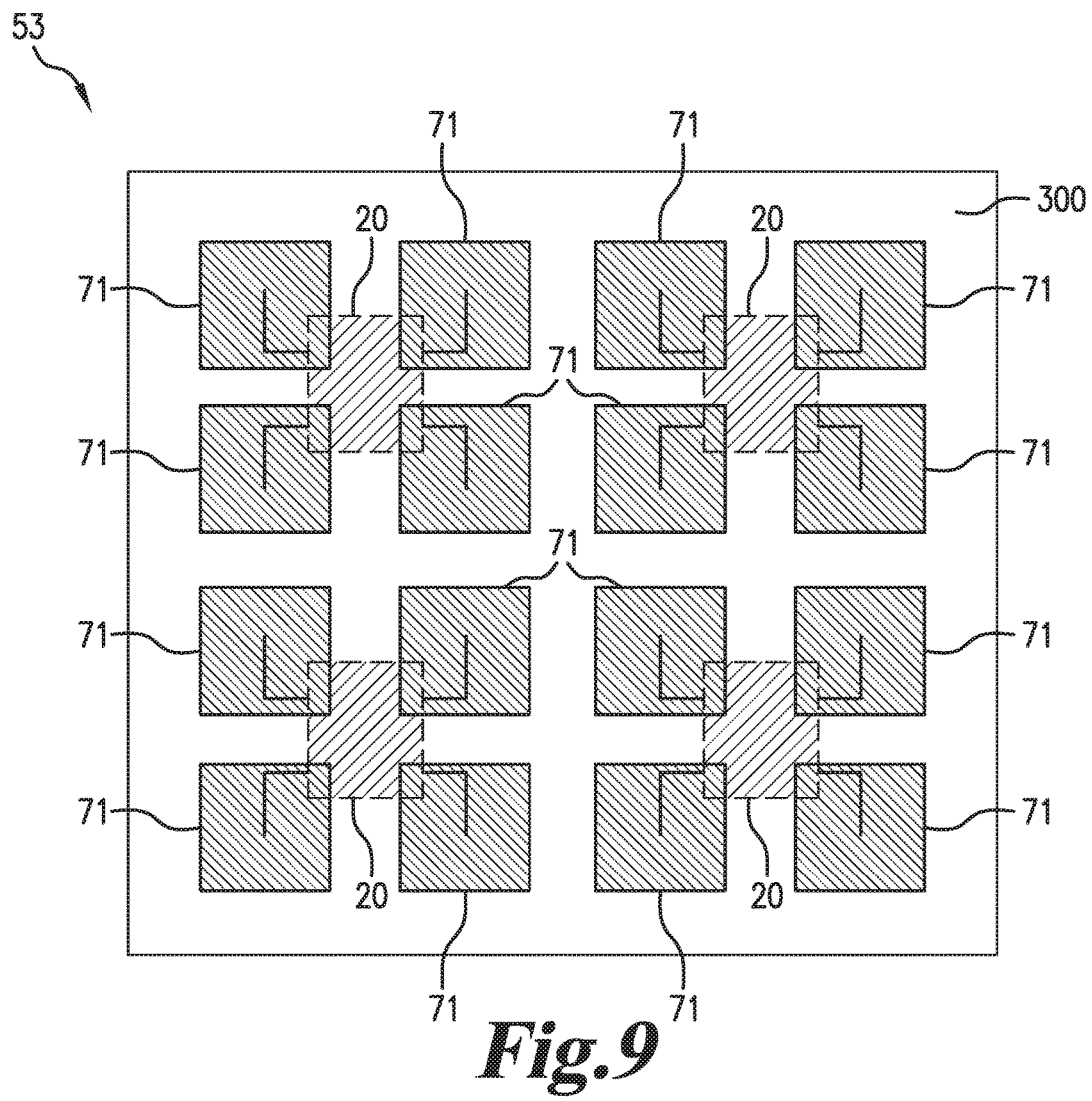
FIG. 9 shows a top view of a fourth embodiment of an antenna apparatus according to the present disclosure.

Using the embodiment illustrated e.g. in FIG. 8 a two-dimensional antenna array antenna can be realized with a desired spacing and a desired number of antennas in two dimensions. FIG. 9 shows a top view of a fourth embodiment of an antenna apparatus 53 according to the present disclosure. In this exemplary embodiment the antenna apparatus comprises four MMICs 20, each coupled to four patch antennas 71 provided on top of the cover layer 300.

Figure 10:
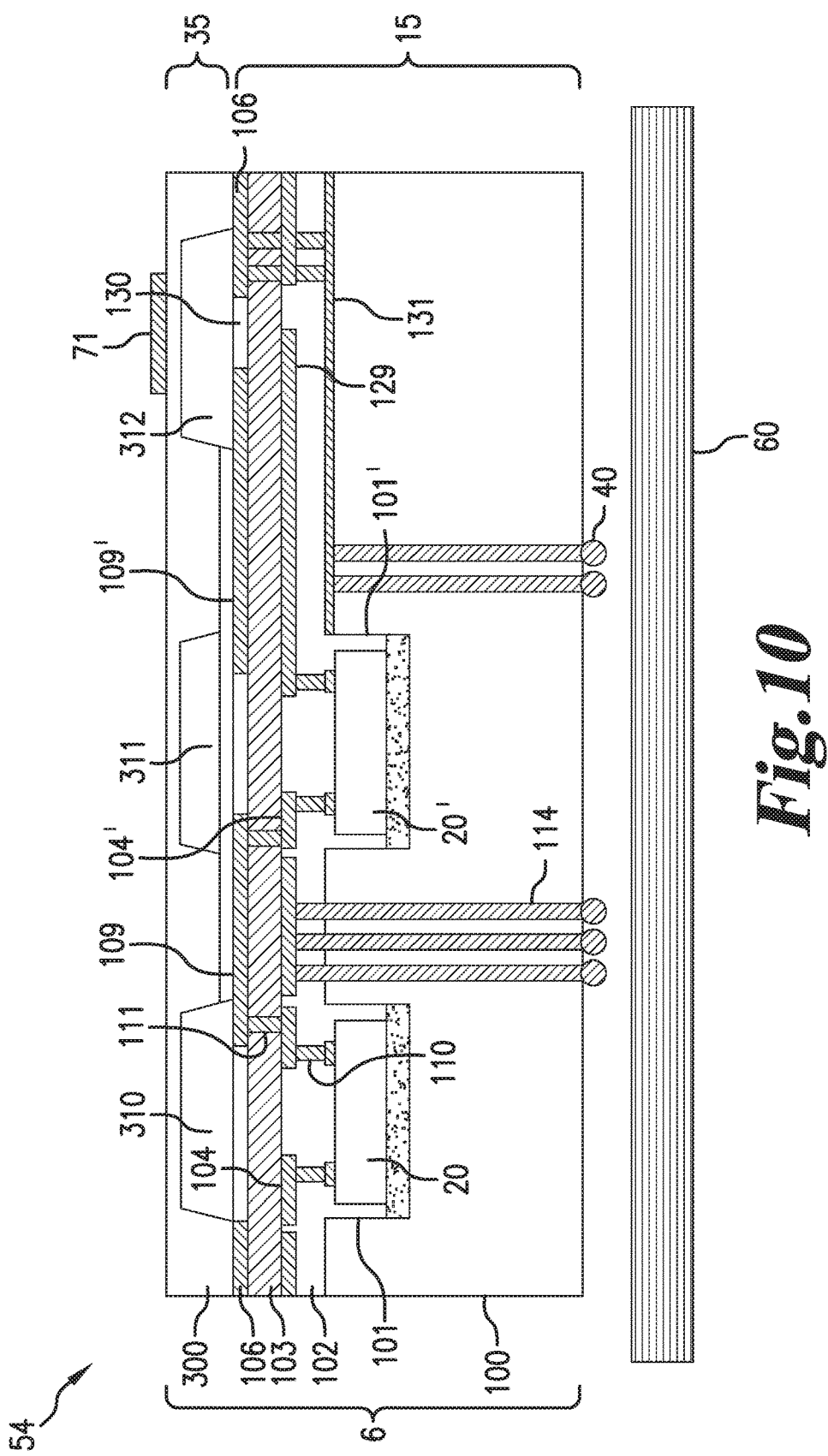
FIG. 10 shows a cross section of a fifth embodiment of an antenna apparatus according to the present disclosure including a sixth embodiment of a package according to the present disclosure.

FIG. 10 shows a cross section of a fifth embodiment of an antenna apparatus 54 according to the present disclosure including a sixth embodiment of a package 6 according to the present disclosure comprising a cover structure 35 and carrier structure 15. In this package 6 the primary antenna 127 of the package 5 shown in FIG. 8 is replaced with a slot coupled feed line 129. The feed line 129 is coupled to the parasitic patch element 71 on the lid 300 through a slot 130. No cavity or backshort is used in this embodiment of the carrier structure 15. The surface of the carrier layer 100 may be fully covered of metal layer 131 acting as a ground plane for the antenna structure, and as a shield between the antennas and the silicon carrier layer 100.

Figure 11:
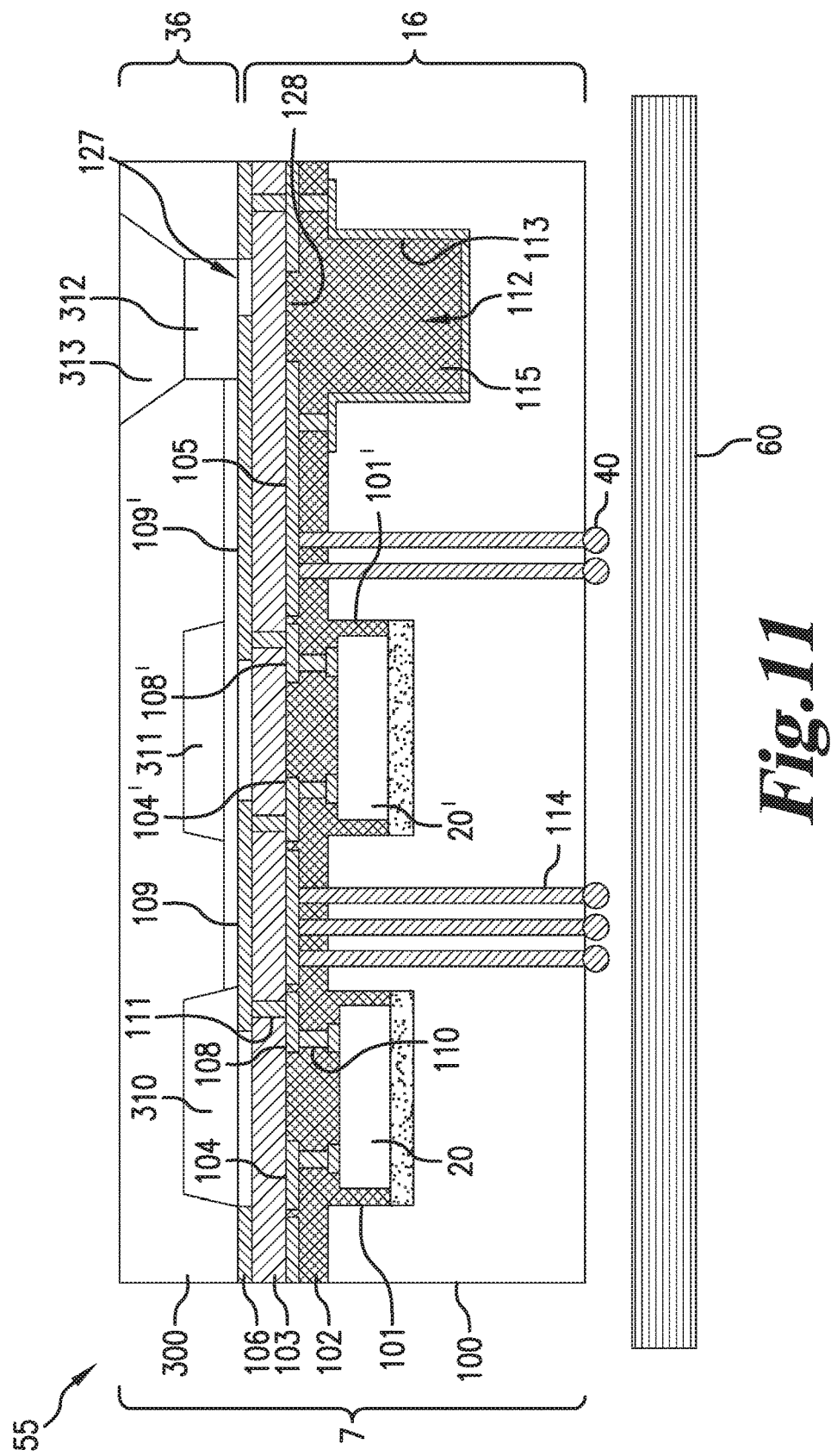
FIG. 11 shows a cross section of a sixth embodiment of an antenna apparatus according to the present disclosure including a seventh embodiment of a package according to the present disclosure.

FIG. 11 shows a cross section of a sixth embodiment of an antenna apparatus 55 according to the present disclosure including a seventh embodiment of a package 7 according to the present disclosure comprising a cover structure 36 and carrier structure 16. In this embodiment the package 55 comprises a horn antenna 313 etched in the lid (cover layer) 300 which is made up of silicon. The thickness, width and shape of the horn antenna 313 can be controlled using dry and wet etching techniques. The inner surface of the horn shape may be metallized as well. Based on the desired shape of the horn antenna, multiple silicon wafers can be shaped and piled up on top of each other to form the cover structure 36.

Air cavities 310, 311 may also be formed above the MMICs 20, 20'. The RF signal, routed to the upper level via signal interconnects 110, 111, is fed to the cavity backed slot antenna 127. This antenna 127 is coupled to the horn antenna 313 via a cavity 312. An additional backshort 112 and a slot 128 on the polymer layer 102 makes the antenna characteristics wideband. Since the backshort 112 is filled with the polymer 115 as filling material with a relative dielectric permittivity higher than 1, the backshort 112 does not need to be long enough to satisfy the $\lambda_g/4$ criteria. The opening of the horn antenna 313 may also be filled with a foam material if required.

In summary, a package and an antenna apparatus including such a package are disclosed, which may be used for mm-wave radar systems operating in a frequency range of 100 GHz and above. All RF components may be incorporated into one package in this way. Routing all RF signals from the bare die to the antennas in a silicon-based package, which is fabricated with μm accuracy results in excellent performance in terms of loss and matching. Interfacing only power supply, bias and IF signals through the pins of the surface mounted package requires only a standard PCB for placing the RF chip onto. Different schemes for integrating antennas into the silicon package and interfacing them to the bare die RF chip, which is also integrated into the silicon package, are disclosed.

The present disclosure may make use of a method of manufacturing by which packages for embedding one or more electronic components, in particular microwave integrated circuits and discrete passive components (e.g. capacitors or resistors), are more or less cast from a single piece of material. The final package is in that sense a kind of monolithic package. The package material is preferably a light sensitive monomer that is steadily poured into place in thin layers and hardened by photo polymerization using light at UV or other wavelengths. Such methods have become available in recent years for manufacturing of microparts and are used for integrating chips at lower frequencies, i.e. frequencies much below the microwave spectrum. Micrometer precision in vertical and lateral dimensions is possible. For manufacturing a package according to the present disclosure the technology of the manufacturing method as disclosed in EP 2477466 A2 may be applied.

The leveling problem of face-up packaging techniques is solved particularly by manufacturing the package monolithically by a process of polymerization of monomers. The package can be developed in height to any practical relevant thickness (typically occurring in practice) and devices (particularly MMICs and passive chip components) of different thicknesses can be embedded in the package in a face-up mounting technique having their front-side contact area at the same height level.

Multiple of the proposed packages can be combined to a full electronic system (for example a transmit system part and a receive system part). In general, one of these packages is a vital part of an electronic system working at mm-wave and THz frequencies that capsule all important microwave functions. The remaining parts are signal processing parts at lower GHz frequencies, e.g. at 0-10 GHz. Also external antenna lens parts or antenna reflector parts are left which would enhance the antenna in the package. The antenna in the package may e.g. illuminate a lens or a reflector. The proposed package that capsules the ram-wave/THz frequency functions of the system may sometimes also be called a system-in-a-package (SiP) even though strictly speaking digital signal processing functions are part of another package (e.g. a conventional package used in microprocessors etc.). However, bare microprocessor chips could be included in the proposed package as well.

According to the present disclosure the package is grown together with the pattern of thermal vias/interconnections (monolithic aspect). The formation of the vias is not limited to circular via shapes. Further, the pattern can be optimized (honeycomb, circular, pillar type etc) to compromise thermal, mechanical and assembly requirements (amount of epoxy/solder consumed by the vias for example). Still further, it takes generally the same time independent of the thermal interconnection pattern to the backside. Preferably, the vias are closed at the backside, which prevents that the epoxy or solder will run underneath the backside of the package.

The package is also relevant for the implementation of phased array systems of different architectures than explained above (e.g. tray or tile array architectures) where multiple receiver and transmitter channels are integrated in one package. In such scenarios often very tight spacing between the channels is required with minimal cross talk. The proposed approach is ideal to meet such requirements. Further, the package is also relevant for integration of systems with microfluidic features, e.g. in mm-wave/THz spectroscopic system.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

It follows a list of further embodiments of the disclosed subject matter:

1. A package (1-7) for embedding one or more electronic components, the package comprising:
   i) a carrier structure (10-16) including
      a silicon-based carrier layer (300) comprising one or more cavities (101, 101') for placing one or more electronic components therein,
      a first polymer layer (102) formed on top of the carrier layer,
      a second polymer layer (103) formed on top of the first polymer layer,
      metallization layers (104-109, 124, 129, 131) for use as signaling and ground layers formed in predetermined areas between the first polymer layer and the second polymer layer and on top of the second polymer layer, and
      interconnection terminals (110, 111) for interconnecting the one or more electronic components and the metallization layers,
   ii) one or more electronic components (20, 20') embedded in one or more cavities formed in the carrier layer,
   iii) a cover structure (30-36) arranged on top of the carrier structure (10-16), the cover structure including
      a cover layer (300) formed of silicon or a mold mass,
      one or more cavities (301, 310, 311, 312) formed at least partly above one or more metallization layers (104-109, 124, 129, 131) used as signaling layers,
      an antenna element (71, 313) and/or a waveguide (302, 305, 306, 309) for connection to an external antenna element (70), the antenna element (71, 313) and/or the waveguide (302, 305, 306) being formed in and/or on top of the cover layer (300) and coupled to the one or more cavities.

2. The package as defined in embodiment 1, wherein the cover structure comprises a rectangular waveguide (302, 305, 306, 309) formed in the cover layer and directly connected to a cavity of the one or more cavities formed in the cover layer.

3. The package as defined in embodiment 2, wherein the rectangular waveguide (302, 305, 306, 309) is filled with air or a filling material.

4. The package as defined in one of the preceding embodiments, further comprising a rectangular waveguide backshort (112, 117) formed in the carrier layer opposite a waveguide (302) or a cavity (312) formed in the cover layer.

5. The package as defined in one of the preceding embodiments, wherein the waveguide (302) is formed through the complete cover structure in a direction perpendicular to the cover layer and wherein a flexible waveguide section (303) is connected with a first end to the waveguide on the side of the waveguide facing away from the carrier structure.

6. The package as defined in one of the preceding embodiments, further comprising a signal feeding element for signal feeding into the waveguide (302, 305, 306) comprising a microstrip feeding line (109, 109'), a microstrip feeding loop (118), a slot coupled feeding line (129) or a substrate integrated waveguide (126) formed on top of the carrier layer.

7. The package as defined in one of the preceding embodiments, wherein one or more waveguides (120, 121, 122) are formed in a direction parallel to the cover layer, wherein the outer ends of the one or more waveguides are formed as antenna apertures (123).

8. The package as defined in embodiment 7, further comprising an additional waveguide (117) per waveguide (305), the additional waveguides being formed in the carrier layer opposite and in parallel to the one or more waveguides, wherein the outer ends of the one or more waveguides are formed as antenna apertures (123).

9. The package as defined in embodiment 7, further comprising a multi-stage transformer (307) per waveguide (309), the multi-stage transformer being formed in the cover layer between a cavity of the cover layer and a waveguide.

10. The package as defined in one of the preceding embodiments, wherein the cover structure comprises one or more patch antennas (71) formed on top of the cover layer, each patch antenna being arranged above an air cavity (312) formed in the cover layer.

11. The package as defined in embodiment 10, further comprising a rectangular waveguide backshort (112) per patch antenna, the waveguide backshort being formed in the carrier layer opposite the respective patch antenna.

12. The package as defined in one of the preceding embodiments, wherein the cover structure comprises one or more antenna apertures (313) formed in the cover layer, each antenna aperture being arranged above and connected to an air cavity (312) formed in the cover layer.

13. The package as defined in embodiment 12, Rather comprising a rectangular waveguide backshort (112) per antenna aperture, the waveguide backshort being formed in the carrier layer opposite the respective antenna aperture.

14. The package as defined in one of the embodiments 4, 11 or 13, wherein the rectangular waveguide backshort (112) is filled with a filling material (115), in particular with polymer.

15. The package as define in one of embodiments 2, 4, 11 or 13, further comprising a metal coating layer (304, 113) formed on the inner surface of the waveguide and/or the waveguide backshort.

16. An antenna apparatus comprising:
a package (1-7) as defined in one of embodiments 1,
one or more antenna elements (70, 71, 123, 312) formed in or on the package or arranged separate from and coupled to the package, and
a board (60) supporting the package.

17. The antenna apparatus as defined in embodiment 16, wherein the waveguide (302) is formed through the complete cover structure in a direction perpendicular to the cover layer, wherein a flexible waveguide section (303) is connected with a first end to the waveguide on the side of the waveguide facing away from the carrier structure and wherein an antenna element (70) is coupled to the second end of the flexible waveguide section.

18. The antenna apparatus as defined in embodiment 17, comprising a plurality of flexible waveguide sections (303a-303g) and an antenna element (70a-70g) per waveguide section coupled to the second end of the respective waveguide section, said antenna elements forming an antenna array.

19. A method of manufacturing a package (1-7) for embedding one or more electronic components, the method comprising:
i) forming a carrier structure (10-16) by
forming in a silicon-based carrier layer (300) one or more cavities (101, 101'),
placing one or more electronic components in said one or more cavities (101, 101'),
forming a first polymer layer (102) on top of the carrier layer,
forming a second polymer layer (103) on top of the first polymer layer,
forming metallization layers (104-109, 124, 129, 131) for use as signaling and ground layers in predetermined areas between the first polymer layer and the second polymer layer and on top of the second polymer layer, and
forming interconnection terminals (110, 111) for interconnecting the one or more electronic components and the metallization layers,
ii) forming a cover structure (30-36) on top of the carrier structure (10-16) by
forming a cover layer (300) of silicon or a mold mass, wherein one or more cavities (301, 310, 311, 312) are formed at least partly above one or more metallization layers (104-109, 124, 129, 131) used as signaling layers, and
forming an antenna element (71, 313) and/or a waveguide (302, 305, 306, 309) for connection to an external antenna element (70) in and/or on top of the cover layer (300) and coupled to the one or more cavities.

The present application claims priority to European Patent Application 15161619.0 filed by the European Patent Office on 30 Mar. 2015, the entire contents of which being incorporated herein by reference.

The invention claimed is:

1. A package for embedding one or more electronic components, the package comprising:
a carrier structure including
a silicon-based carrier layer comprising one or more cavities for placing one or more electronic components therein,
a first polymer layer located on top of the carrier layer,
a second polymer layer located on top of the first polymer layer,
metallization layers for use as signaling and ground layers located in predetermined areas between the first polymer layer and the second polymer layer and on top of the second polymer layer, and
interconnection terminals for interconnecting the one or more electronic components and the metallization layers;
one or more electronic components embedded in the one or more cavities in the carrier layer; and
a cover structure arranged on top of the carrier structure, the cover structure including
a cover layer of silicon or a mold mass,
one or more cavities located at least partly above one or more of the metallization layers used as signaling layers, and
a waveguide for connection to an external antenna element, the waveguide located in the cover layer and coupled to the one or more cavities, wherein
the waveguide is formed through the cover structure in a direction perpendicular to the cover layer, and a flexible waveguide section is connected with a first end to the waveguide on a side of the waveguide facing away from the carrier structure.

2. The package as claimed in claim 1, wherein
the waveguide is rectangular, and
the waveguide is directly connected to a cavity of the one or more cavities.

3. The package as claimed in claim 2, therein the rectangular waveguide is filled with air or a filling material.

4. The package as claimed in claim 2, further comprising a metal coating layer formed on an inner surface of the waveguide or an inner surface of a waveguide backshort.

5. The package as claimed in claim 1, further comprising a rectangular waveguide backshort formed in the carrier layer opposite the waveguide or a cavity formed in the cover layer.

6. The package as claimed in claim 5, wherein the rectangular waveguide backshort is filled with a polymer filling material.

7. The package as claimed in claim 1, further comprising:
a signal feeding element for signal feeding into the waveguide, wherein
the signal feeding element comprises a microstrip feeding line.

8. An antenna apparatus, comprising:
the package as claimed in claim 1;
one or more antenna elements formed on the package or arranged separate from and coupled to the package; and
a board supporting the package.

9. The antenna apparatus as claimed in claim 8, further comprising a plurality of flexible waveguide sections and an antenna element per waveguide section coupled to the second end of the respective waveguide section, said antenna elements forming an antenna array.

10. A method of manufacturing a package for embedding one or more electronic components, the method comprising:
forming a carrier structure by:
forming in a silicon-based carrier layer one or more cavities;
placing one or more electronic components in said one or more cavities;
forming a first polymer layer on top of the carrier layer;
forming a second polymer layer on top of the first polymer layer;
forming metallization layers for use as signaling and ground layers in predetermined areas between the first polymer layer and the second polymer layer and on top of the second polymer layer; and
forming interconnection terminals for interconnecting the one or more electronic components and the metallization layers; and
forming a cover structure on top of the carrier structure by:
forming a cover layer of silicon or a mold mass, wherein one or more cavities are formed at least partly above one or more metallization layers used as signaling layers; and
forming a waveguide for connection to an external antenna element in the cover layer and coupled to the one or more cavities, wherein
the waveguide is formed through the cover structure in a direction perpendicular to the cover layer, and
a flexible waveguide section is connected with a first end to the waveguide on a side of the waveguide facing away from the carrier structure.

\* \* \* \* \*